(12) United States Patent
Isogai

(10) Patent No.: US 9,953,838 B2
(45) Date of Patent: Apr. 24, 2018

(54) SUBSTRATE TREATMENT APPARATUS AND SUBSTRATE TREATMENT METHOD

(71) Applicant: TOSHIBA MEMORY CORPORATION, Tokyo (JP)

(72) Inventor: Tatsunori Isogai, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/056,069

(22) Filed: Feb. 29, 2016

(65) Prior Publication Data

US 2016/0358780 A1    Dec. 8, 2016

(30) Foreign Application Priority Data

Jun. 3, 2015   (JP) ................................. 2015-113200

(51) Int. Cl.
  *H01L 21/324*       (2006.01)
  *H01L 21/67*        (2006.01)
  (Continued)

(52) U.S. Cl.
  CPC ...... *H01L 21/28176* (2013.01); *H01L 21/268* (2013.01); *H01L 21/28185* (2013.01);
  (Continued)

(58) Field of Classification Search
  CPC . H01L 21/324; H01L 21/3247; H01L 21/326; H01L 21/02318; H01L 21/0234; H01L 21/02356–21/02359; H01L 21/28176–21/28185; H01L 21/268; H01L 21/67115; H01L 31/1864; H01L 21/3105; H05B 6/647; H05B 6/6482; H05B 6/80; H05B 6/806
  See application file for complete search history.

(56) References Cited

U.S. PATENT DOCUMENTS 4,517,026 A * 5/1985 Inoue ................... H01L 21/324
                                                        219/686
5,302,226 A * 4/1994 Yamazaki ......... H01J 37/32192
                                                        118/723 R
(Continued)

FOREIGN PATENT DOCUMENTS

JP           4-260330       9/1992
JP           11-150283      6/1999
WO      WO 2006/054785     5/2006

*Primary Examiner* — Marvin Payen
*Assistant Examiner* — Jeremy Joy
(74) *Attorney, Agent, or Firm* — Finnegan, Henderson, Farabow, Garrett & Dunner, L.L.P.

(57) ABSTRACT

In accordance with an embodiment, a substrate treatment apparatus includes a housing, a magnetic field generating portion and a microwave supply portion. The housing is configured to contain a substrate comprising a conductive layer and an insulating film in contact with the conductive layer. The magnetic field generating portion is configured to generate a magnetic field which penetrates the substrate. The microwave supply portion is configured to generate a microwave to heat the substrate, to apply the microwave to the substrate provided in the magnetic field in such a manner that the microwave is absorbed by unpaired electrons at an interface between the conductive layer and the insulating film or in the insulating film.

20 Claims, 2 Drawing Sheets

(51) Int. Cl.
  *H01L 21/28*    (2006.01)
  *H01L 21/268*   (2006.01)
  *H05B 6/80*     (2006.01)
  *H01L 21/3105*  (2006.01)

(52) U.S. Cl.
  CPC ........ *H01L 21/3105* (2013.01); *H01L 21/324* (2013.01); *H01L 21/67115* (2013.01); *H05B 6/80* (2013.01); *H05B 6/806* (2013.01)

(56) References Cited

U.S. PATENT DOCUMENTS

| | | | | |
|---|---|---|---|---|
| 5,611,864 A * | 3/1997 | Kimura | ................ | C23C 14/357 |
| | | | | 118/723 MR |
| 7,473,656 B2 * | 1/2009 | Klostermann | .... | H01L 21/67115 |
| | | | | 117/3 |
| 7,928,021 B2 * | 4/2011 | Kowalski | .............. | H01L 21/324 |
| | | | | 257/E21.001 |
| 2003/0157813 A1 * | 8/2003 | Downey | ............... | H01L 21/324 |
| | | | | 438/795 |
| 2006/0003603 A1 * | 1/2006 | Fukuchi | ............ | H01J 37/32192 |
| | | | | 438/787 |
| 2007/0108195 A1 * | 5/2007 | Tian | ........................ | B23K 13/01 |
| | | | | 219/702 |
| 2010/0024732 A1 * | 2/2010 | Mokhlesi | ............... | C23C 16/308 |
| | | | | 118/724 |
| 2010/0043976 A1 * | 2/2010 | Watanabe | ......... | H01J 37/32192 |
| | | | | 156/345.41 |
| 2012/0138922 A1 * | 6/2012 | Yamazaki | ........... | H01L 29/7869 |
| | | | | 257/43 |
| 2013/0078789 A1 * | 3/2013 | Nakayama | ............ | H01L 21/223 |
| | | | | 438/513 |
| 2013/0078816 A1 * | 3/2013 | Hirano | .............. | H01L 21/02068 |
| | | | | 438/715 |
| 2014/0004690 A1 * | 1/2014 | Isogai | ................ | H01L 21/3003 |
| | | | | 438/586 |
| 2014/0183529 A1 * | 7/2014 | Yamazaki | ........... | H01L 29/7869 |
| | | | | 257/43 |
| 2015/0289316 A1 * | 10/2015 | Shimizu | ............... | H05B 6/6447 |
| | | | | 438/795 |
| 2015/0305097 A1 * | 10/2015 | Ashida | .................... | H05B 6/80 |
| | | | | 219/690 |

* cited by examiner

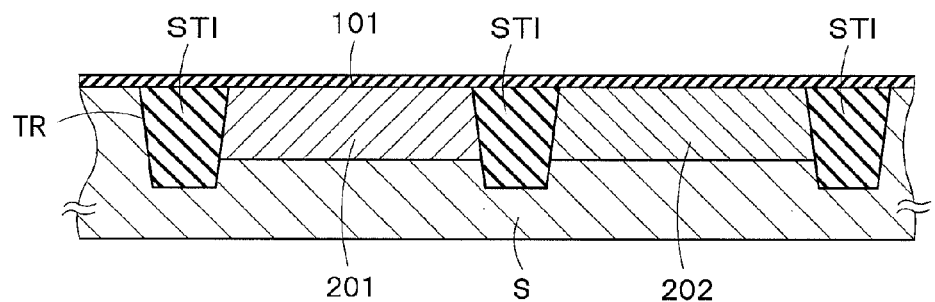
F I G. 2
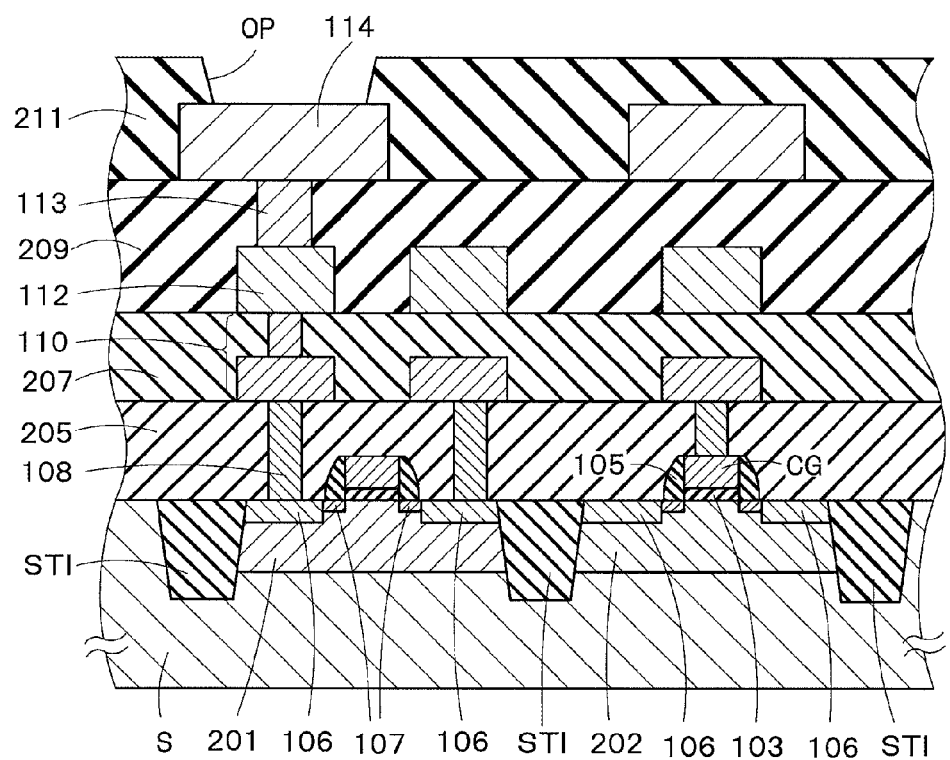
F I G. 3

SUBSTRATE TREATMENT APPARATUS AND SUBSTRATE TREATMENT METHOD

CROSS REFERENCE TO RELATED APPLICATIONS

This application is based upon and claims the benefit of priority from the prior Japanese Patent Application No. 2015-113200, filed on Jun. 3, 2015, the entire contents of which are incorporated herein by reference.

FIELD

Embodiments described herein relate generally to a substrate treatment apparatus and a substrate treatment method.

BACKGROUND

In a process of forming a semiconductor device such as a metal-insulator-semiconductor (MIS), an annealing process may be introduced to modify an insulating film or an interface between the insulating film and a conductor layer (e.g. a semiconductor layer).

Here, the "interface modification" means the effect of reducing interface state density in terms of electric properties by eliminating or deactivating (e.g. terminating with other atoms) dangling bonds of a semiconductor existing at the interface between the insulating film and the conductor layer. A typical example is what is called a sintering process or a hydrogen sintering process in a manufacturing process of a semiconductor device. This sintering process is intended to thermally treat a wafer in an atmosphere including hydrogen and thereby terminate and stabilize, with hydrogen, the dangling bonds existing, for example, at an interface between a gate insulating film and a semiconductor substrate in the final process of fabricating a semiconductor circuit on the wafer or in its neighboring process.

However, when a metallic interconnection is already formed on a substrate to be treated, temperature regulation is required for the sintering process with consideration for a heat load on the metallic interconnection.

Even when there is no metallic interconnection, the treatment temperature needs to be decided so as to prevent unnecessary diffusion of impurity atoms of, for example, boron or phosphorus that has been introduced into the substrate.

BRIEF DESCRIPTION OF THE DRAWINGS

FIG. 2 and FIG. 3 are examples of schematic sectional views illustrating a substrate treatment method according to one embodiment.

DETAILED DESCRIPTION

Figure 1:
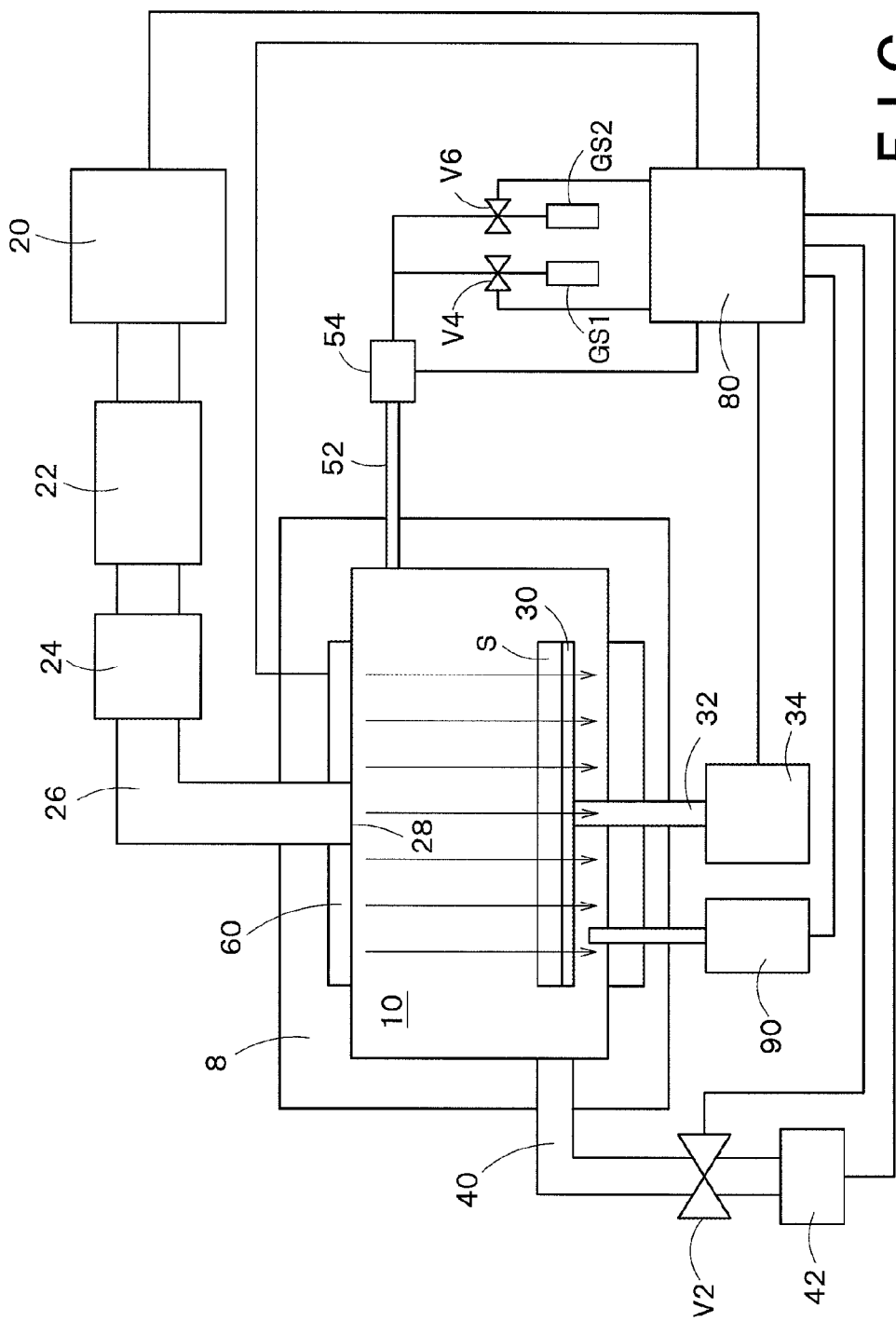
FIG. 1 is an example of a block diagram showing a schematic configuration of a substrate treatment apparatus according to one embodiment.

In accordance with an embodiment, a substrate treatment apparatus includes a housing, a magnetic field generating portion and a microwave supply portion. The housing is configured to contain a substrate comprising a conductive layer and an insulating film in contact with the conductive layer. The magnetic field generating portion is configured to generate a magnetic field which penetrates the substrate. The microwave supply portion is configured to generate a microwave to heat the substrate, to apply the microwave to the substrate provided in the magnetic field in such a manner that the microwave is absorbed by unpaired electrons at an interface between the conductive layer and the insulating film or in the insulating film.

Embodiments will now be explained with reference to the accompanying drawings. Like components are provided with like reference signs throughout the drawings and repeated descriptions thereof are appropriately omitted. It is to be noted that the accompanying drawings illustrate the invention and assist in the understanding of the illustration and that the shapes, dimensions, and ratios and so on in each of the drawings may be different in some parts from those in an actual apparatus.

In the specification of the present application, "stacking" not only includes stacking layers in contact with each other but also includes staking layers with another layer interposed in between. "Providing on" not only includes providing a layer in direct contact with a layer but also includes providing a layer on a layer with another layer interposed therebetween. Moreover, terms indicating directions such as "upper" and "lower" in the explanation show relative directions when a wiring formation side in a given layer on a later-described substrate is set as the top. Therefore, the directions may be different from actual directions based on gravitational acceleration directions.

(1) Substrate Treatment Apparatus

FIG. 1 is an example of a block diagram showing a schematic configuration of a substrate treatment apparatus according to one embodiment. The substrate treatment apparatus according to the present embodiment includes a chamber housing 8, a magnetron 20, a substrate holder 30, an electromagnetic portion 60, and a control portion 80.

The chamber housing 8 is made of a metallic material such as an aluminum alloy, and its internal space constitutes a treatment chamber 10 to treat a substrate S.

The magnetron 20 generates microwaves having a particular frequency, and supplies the microwaves, via a waveguide tube 26, to the treatment chamber 10 from a waveguide opening 28 which is in communication with the treatment chamber 10. An isolator 22 and a matching portion 24 are provided from the upstream side in order between the magnetron 20 and the waveguide opening 28. The isolator 22 converts the microwaves which has been reflected in the treatment chamber 10 and then returned from the treatment chamber 10, into heat, and then discharges the heat. As a result, the backward flow of the microwaves to the magnetron 20 is prevented. The matching portion 24 is also called a matcher, and adjusts in such a manner that microwaves are efficiently supplied into the treatment chamber 10 by a small amount of reflected waves. In the present embodiment, the magnetron 20, the isolator 22, the matching portion 24, and the waveguide tube 26 correspond to, for example, a microwave supply portion.

The substrate holder 30 holds the substrate S. The substrate holder 30 is made of a material such as quartz that transmits microwaves. The substrate holder 30 is held in such a manner as to be able to rotate around a rotation shaft 32. The rotation shaft 32 is coupled to a substrate driving portion 34. The substrate driving portion 34 is electrically connected to the control portion 80, and horizontally rotates the substrate S via the rotation shaft 32 at a predetermined rotational velocity in accordance with a control signal sent from the control portion 80, thereby improving in-plane uniformity in a process. The substrate driving portion 34 also vertically moves in accordance with a control signal sent from the control portion 80 as needed, thereby changing the height of the substrate S.

A gas discharge pipe 40 is provided, for example, in the lower part of the treatment chamber 10 and in the lower wall of the chamber housing 8, and is coupled to a vacuum pump 42 via a pressure regulating valve V2. The pressure regulating valve V2 and the vacuum pump 42 are electrically connected to the control portion 80, and adjust the pressure in the treatment chamber 10 to a desired value in accordance with a control signal from the control portion 80.

A gas supply pipe 52 is provided, for example, on the side wall of the chamber housing 8, and is coupled to gas sources GS1 and GS2 via a gas flow volume adjustment portion 54 and valves V4 and V6 and thus supplies a process gas such as nitrogen ($N_2$), oxygen ($O_2$), or hydrogen ($H_2$) to the treatment chamber 10. The gas flow volume adjustment portion 54 is electrically connected to the control portion 80, and adjusts the flow volume of the gas in accordance with a control signal from the control portion 80. The valves V4 and V6 are also electrically connected to the control portion 80, and open and close in accordance with a control signal from the control portion 80.

In the present embodiment, the electromagnetic portion 60 corresponds to, for example, a magnetic field generating portion, and is provided on the upper and lower wall surfaces of the chamber housing 8 across the substrate S. The electromagnetic portion 60 is electrically connected to the control portion 80, and generates a magnetic field that vertically penetrates the substrate S at desired intensity in response to a command signal from the control portion 80.

Various forms of specific configurations of the electromagnetic portion 60 are conceivable. Although not shown in particular, one example of a configuration can be shown. In this configuration, electromagnetic portions in which coils serving as conductors are wound around columnar iron cores and then connected to an electric source are arranged along the wall surface of the chamber housing 8 in matrix form so as to cover the substrate S held onto the substrate holder 30 after the directions of the electromagnetic portions are adjusted so that the longitudinal direction of each of the iron cores is parallel to the longitudinal direction of the rotation shaft 32.

A thermometer 90 is provided in the vicinity of the substrate holder 30 so as not to contact the substrate S. The thermometer 90 is electrically connected to the control portion 80, and monitors the process temperature inside the treatment chamber 10.

The control portion 80 is electrically connected to the magnetron 20, the electromagnetic portion 60, the vacuum pump 42, the pressure regulating valve V2, the gas flow volume adjustment portion 54, the valves V4 and V6, the substrate driving portion 34, and the thermometer 90, and controls the operation of each of these components.

Next, the operation of the substrate treatment apparatus shown in FIG. 1 is described.

First, the substrate S to be treated is carried into the treatment chamber 10 via an unshown gate, and held onto the substrate holder 30. The substrate S includes a conductive layer (e.g. a gate electrode having a semiconductor layer) formed at least on a surface thereof, and an insulating film formed in contact with this conductive layer (refer to FIG. 3).

A control signal is then outputted from the control portion 80 to the pressure regulating valve V2 and the vacuum pump 42, and the gas in the treatment chamber 10 is discharged from the gas discharge pipe 40 by the vacuum pump 42. A control signal is also then outputted from the control portion 80 to the valves V4 and V6 and the gas flow volume adjustment portion 54, and a process gas is supplied into the treatment chamber 10 from the gas sources GS1 and GS2 via the gas supply pipe 52. The pressure in the treatment chamber 10 is adjusted to a predetermined value by the gas flow volume adjustment portion 54.

On the basis of a control signal from the control portion 80, the substrate S is then rotated by the substrate driving portion 34 at a velocity of, for example, about 10 to about 100 rpm. At the same time, microwaves are generated by the magnetron 20, introduced into the treatment chamber 10 from the waveguide opening 28 via the waveguide tube 26, and applied to the substrate S for a predetermined length of time. Then, a control signal is supplied to the electromagnetic portion 60 from the control portion 80 to excite a predetermined intensity of a magnetic field in conjunction with the application of the microwaves. In the present embodiment, the generated magnetic field is applied so as to penetrate the substrate S in the direction perpendicular to the surface of the substrate S as indicated by an arrow in FIG. 1.

The frequency of the microwaves preferably ranges from 0.8 GHz to 25 GHz.

The frequency of the magnetic field has only to be several hundred Hz below the degree at which a coiled conductor generates heat when the member other than the substrate S to be treated, for example, the electromagnetic portion 60 has such a conductor. A commercial alternating-current voltage of, for example, 50 Hz or 60 Hz may be used, or a permanent magnet may be used as the simplest configuration to apply a direct-current magnetic field.

The magnetic field is applied to the substrate S in conjunction with the application of the microwaves for the following reasons:

A dangling bond has an unpaired electron (an electron having no pairing electron in covalent bonding) which varies a threshold voltage in the insulating film and thus causes a leak current increase and which traps carriers at an interface between the insulating film and the conductive layer and therefore has an adverse effect on the operation of a transistor. It is known that the energy level of the unpaired electron is divided into two by application of a magnetic field. This is attributed to the spin quantum number of the electron, and is called Zeeman effect. The difference of the divided energy levels of the unpaired electron substantially corresponds to the frequency band of the microwaves when converted to the frequency of electromagnetic waves. Thus, if the microwaves are applied in this state, the microwaves can be directly absorbed into the dangling bonds and disperse the dangling bonds. As a result, modification effects can be efficiently obtained. The condition in which resonance occurs is represented by the following equation:

$$g=(h\nu)/(\beta H) \quad \text{(Equation 1)}$$

wherein g is a constant number which is called a g-value and which is decided by the kind of dangling bond. For example, g=2.0060 in the case of silicon (Si) dangling bonds at an interface between a silicon oxide film ($SiO_2$) and silicon (Si), whereas g=2.0005 in the case of silicon (Si) dangling bonds in a silicon oxide film ($SiO_2$). In addition, h is Planck's constant, ν is the wavelength of the microwaves, β is a constant number called Bohr magneton, and H is magnetic field intensity. A specific condition that uses the above equation will be described later in more detail in an embodiment regarding a substrate treatment method.

In the present embodiment, the output power of the microwaves is set at several hundred W to several kW. This is intended for the heating of the substrate S.

The substrate S is rotated by the substrate driving portion 34 at the predetermined rotational velocity and therefore uniformly heated.

In the present embodiment the electromagnetic portion 60 is provided in such a manner that a magnetic flux penetrates the substrate S in the direction perpendicular to the surface of the substrate S similar to the entrance direction of the microwaves. However, as long as a magnetic field of appropriate intensity, for example, satisfying Equation (1) above is excited, the relation between the direction of the magnetic flux and the entrance direction of the microwaves does not matter.

As described above, if the heat treatment has finished after the application of the microwaves for the predetermined length of time simultaneous with the application of the magnetic field to the substrate S, the output power of the microwaves by the magnetron 20 is stopped to stop the introduction of the microwaves into the treatment chamber 10. After the excitation of the magnetic field by the electromagnetic portion 60 has been stopped, the rotation of the substrate S by the substrate driving portion 34 is stopped, and the heated substrate S is carried out of the treatment chamber 10.

The substrate treatment apparatus according to at least one embodiment described above includes the electromagnetic portion 60 which generates the magnetic field that penetrates the substrate S and the magnetron 20 which generates microwaves of the output power sufficient to heat the substrate S and then applies the microwaves to the substrate S. Therefore, the microwaves can be directly absorbed into the dangling bonds at the interface between the semiconductor layer and the insulating film or in the insulating film. Consequently, it is possible to selectively heat the interface or the insulating film, and efficiently reduce the dangling bonds.

(2) Substrate Treatment Method

Next, a manufacturing method of a semiconductor device using the substrate treatment apparatus shown in FIG. 1 is described with reference to FIG. 2 and FIG. 3 as the substrate treatment method according to one embodiment.

A manufacturing method of a MIS transistor with three-layer metallic interconnection for a general logic circuit is shown below by way of example. The substrate treatment method according to the present embodiment is preferably applied at the stage immediately after the formation of an insulating film or at the stage where the whole element structure has been formed. Each of these two cases is described below. However, the substrate treatment method according to the present embodiment is not limited to one of these cases, and is applicable in any process, for example, at both stages.

Moreover, the substrate treatment method according to the present embodiment is not exclusively applied to an interface between a gate insulating film and a conductive layer (e.g. a semiconductor layer) of a logic large-scale integration (LSI), but is applicable to general purposes in which the stabilization of the interface is also required, for example, is applicable to a complementary metal oxide semiconductor (CMOS) image sensor.

(a) Application at the Stage Immediately after the Formation of the Insulating Film First, as shown in FIG. 2, a shallow trench TR for element isolation is formed in the substrate S in which a monocrystalline silicon layer is formed on the surface. After the trench TR is filled with an insulating film, an element isolation region ST1 is formed through a planarization process.

Subsequently, the conductivity types of wells 201 and 202 and desired values of density thereof are controlled by ion implantation and a thermal annealing treatment, a gate insulating film 101 is then formed on the entire surface. In the present embodiment, a silicon oxide film ($SiO_2$) is formed as the gate insulating film 101. However, the gate insulating film 101 is not exclusively the silicon oxide film ($SiO_2$). For example, a high-dielectric-constant film or a stack structure of plural kinds of insulating films may be used. In the present embodiment, the wells 201 and 202 correspond to, for example, conductive layers.

As shown in FIG. 2, at the stage where the silicon oxide film ($SiO_2$) on the wells 201 and 202 is manufactured, the substrate S is carried into microwave annealing equipment and then annealed. The microwave annealing equipment may be either a single-wafer type or a batch type. The substrate treatment apparatus shown in FIG. 1 is used here, so that the substrate S is carried into the treatment chamber 10 and held by the substrate holder 30.

While the substrate S is being horizontally rotated by the substrate driving portion 34, microwaves of 0.8 GHz to 25 GHz are generated by the magnetron 20 with a power of 100 W to 10 Kw, and the substrate S is introduced into the treatment chamber 10 from the waveguide opening 28 and treated for 30 seconds to 60 minutes at a substrate temperature of 600° C. to 850° C. Inert gases such as nitrogen ($N_2$) and argon (Ar) are supplied to the treatment chamber 10 from the gas source GS1 as a treatment atmosphere in microwave annealing. In addition to these gases, hydrogen ($H_2$), for example, may be added at, for example, about 10% from the gas source GS2. The pressure during the treatment may be any one of pressurization, normal pressure, and decompression.

In the present embodiment, in conjunction with the application of the microwaves, a magnetic field is excited by the electromagnetic portion 60 and is applied to the substrate S so as to penetrate the substrate S. If the frequency of the magnetic field is several hundred Hz or less, an electromagnet that uses, for example, a commercial alternating-current voltage of 50 Hz or 60 Hz may be used, or a permanent magnet may be used as a source. However, intensity that can heat the substrate S is needed, so that the magnetic field is excited at an intensity of several hundred to several thousand gauss.

More specifically, when microwaves of 2.45 GHz which is a commercial frequency are used, the microwaves can be efficiently absorbed into the dangling bonds at the interface between the silicon oxide film and the silicon layer (the wells 201 and 202) if the magnetic field intensity is set at 873 gauss. In addition, if the magnetic field intensity is set at 875 gauss, the microwaves can be efficiently absorbed into the dangling bonds in the silicon oxide film.

Furthermore, it is possible to conduct a treatment such that the magnetic field intensity varies between 873 gauss and 875 gauss during the treatment, for example, in order to reduce both of the above dangling bonds, This can be achieved if a permanent magnet (corresponding to the electromagnetic portion 60 in the apparatus shown in FIG. 1) is used as a magnetic field source and its drive current is adjusted (e.g. by the control portion 80).

Similarly, when microwaves of 5.8 GHz which is a commercial frequency are used, 2066 gauss is suited to the dangling bonds at the interface between the silicon oxide film and the silicon layer, and 2071 gauss is suited to the dangling bonds in the silicon oxide film. For other dangling bonds, it is also possible to calculate optimum magnetic field intensity by using Equation (1) above if the g-value is known.

The substrate S which has undergone the heating and the interface modification treatment is then taken out of the treatment chamber 10, and a series of processes up to the following are performed as shown in FIG. 3: the formation of a gate electrode CG and a sidewall insulating film 105, the formation of an impurity diffusion region 106 and an extension region 107 to be a source and a drain, the formation of a before-wiring interlayer insulating film 205 and the formation of a metallic plug 108, the formation of a first-layer interlayer insulating film 207, the formation of a first-layer metallic interconnection 110, the formation of a second-layer interlayer insulating film 209, the formation of a second-layer metallic interconnection 112 and a via 113, the formation of a third-layer metallic interconnection 114, the formation of a passivation film 211, and the formation of an opening OP down to the third-layer metallic interconnection 114 serving as a pad electrode. These processes require no special methods, and standard manufacturing processes can be used.

(b) Application at the Stage where the Whole Element Structure has been Formed

Instead of the heat treatment immediately after the formation of the gate insulating film 101, the substrate S may be carried into the microwave annealing equipment, for example, the substrate treatment apparatus shown in FIG. 1 after the formation of the whole element structure and annealed by microwave application in a magnetic field.

In this case, the basic treatment conditions are similar to those described above in "(a) Application at the stage immediately after the formation of the insulating film". However, the temperature zone is limited and set to a range of about 300° C. to about 450° C. because the damage to the metallic interconnection needs to be avoided.

In general, in an LSI having a multilayer metallic interconnection structure, a MOS transistor is mostly disposed as if hidden by the metallic interconnection when seen right from the top, that is, from the side of the passivation film 211.

Under such circumstances, when microwaves are applied from the side of the passivation film 211, the microwaves are reflected or absorbed by the metallic interconnection (e.g. the metallic interconnections 110 and 112 shown in FIG. 3) along the way, so that the microwaves may not be sufficiently applied to the interface between the gate insulating film and the conductive layer, and no sufficient effect of interface state reduction may be obtained, and moreover, pattern dependence of in-plane temperature distribution may occur.

In this case, applying microwaves from the rear side of the substrate, that is, from the side opposite to the surface in which the gate insulating film is formed is effective. There are normally no circuit patterns on the rear surface of the substrate and thus no metallic layers are formed on the rear surface of the substrate. Therefore, the microwaves applied from the rear surface are considered to efficiently and uniformly act on the interface between the gate insulating film and the conductive layer. When the substrate treatment apparatus shown in FIG. 1 is used, it is only necessary that the substrate holder 30 hold the substrate in such a manner that the side on which an element, for example, a transistor is formed faces the substrate driving portion 34.

It should be understood that a waveguide opening of microwaves may be provided in each of the opposite wall surfaces of the chamber housing so that microwaves may be simultaneously applied from both the upper and rear sides. In a normal LSI, materials that absorb or block a magnetic field are not used, so that it need not to be taken into consideration how a magnetic field is applied.

According to the substrate treatment method in at least one embodiment described above, while a magnetic field is applied to the substrate S including the wells 201 and 202 and the gate insulating film 101, microwaves with output power sufficient to heat the substrate S is applied to the substrate S to efficiently reduce the dangling bonds in the insulating film or at the interface between the insulating film and the conductive layer, so that desired interface modification effects can be efficiently obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate treatment apparatus comprising:
a housing configured to contain a substrate comprising a conductive layer and an insulating film in contact with the conductive layer;
a magnetic field generating portion configured to generate a magnetic field which penetrates the substrate; and
a microwave supply portion configured to generate a microwave to heat the substrate, the microwave being applied to the substrate provided in the magnetic field, the microwave having a frequency such that it is directly absorbed by unpaired electrons at an interface between the conductive layer and the insulating film or in the insulating film, wherein
the magnetic field generating portion applies the magnetic field to the substrate in conjunction with the application of the microwave.

2. The apparatus of claim 1, wherein assuming that H is magnetic field intensity, H is decided so as to satisfy the following equation:

$$g=(h\nu)/(\beta H) \tag{Equation 1}$$

in which h is Planck's constant, ν is the wavelength of the microwave, β is Bohr magneton and g is a constant number decided by the kind of dangling bond.

3. The apparatus of claim 1, wherein the microwave supply portion applies the microwave into the substrate from at least one of the side of the substrate on which the insulating film is formed and the side opposite to the surface of substrate on which the insulating film is formed.

4. The apparatus of claim 1, wherein the magnetic field generating portion generates the magnetic field at a frequency less than a frequency at which heat is generated outside the substrate.

5. The apparatus of claim 4, wherein the magnetic field generating portion comprises a permanent magnet, and generates a direct-current magnetic field.

6. A substrate treatment apparatus comprising:
a housing configured to contain a substrate comprising a conductive layer and an insulating film in contact with the conductive layer;

a magnetic field generating portion configured to generate a magnetic field and applies the magnetic field to the substrate;

a microwave supply portion configured to generate a microwave to heat the substrate, the microwave being applied to the substrate provided in the magnetic field, the microwave having a frequency such that it is directly absorbed by unpaired electrons at an interface between the conductive layer and the insulating film or in the insulating film, wherein assuming that h is Planck's constant, ν is the wavelength of the microwave, β is Bohr magneton, H is magnetic field intensity and g is a constant number decided by the kind of dangling bond, the magnetic field intensity H is decided so as to satisfy the following equation:

$$g=(h\nu)/(\beta H) \tag{Equation 1}$$, and the magnetic field generating portion applies a magnetic field to the substrate, in conjunction with the application of the microwaves.

7. The apparatus of claim 6, wherein the microwave supply portion applies the microwave into the substrate from at least one of the side of the substrate on which the insulating film is formed and the side opposite to the surface of the substrate on which the insulating film is formed.

8. The apparatus of claim 6, wherein the magnetic field generating portion generates the magnetic field at a frequency less than a frequency at which heat is generated outside the substrate.

9. The apparatus of claim 8, wherein the magnetic field generating portion comprises a permanent magnet, and generates a direct-current magnetic field.

10. A substrate treatment method comprising:

while applying a magnetic field to a substrate comprising a conductive layer and an insulating film in contact with the conductive layer, applying a microwave to the substrate, the microwave having a frequency such that it is directly absorbed by unpaired electrons at an interface between the conductive layer and the insulating film or in the insulating film, and the intensity of the microwave being sufficient to heat the substrate.

11. The method of claim 10, wherein the magnetic field is applied in a direction to penetrate the substrate.

12. The method of claim 10, wherein assuming that h is Planck's constant, ν is the wavelength of the microwave, β is Bohr magneton, H is magnetic field intensity and g is a constant number decided by the kind of dangling bond, the magnetic field intensity H is decided so as to satisfy the following equation:

$$g=(h\nu)/(\beta H) \tag{Equation 1}$$.

13. The method of claim 10, wherein the microwave is applied from at least one of the side of the substrate on which the insulating film is formed and the side opposite to the surface of the substrate on which the insulating film is formed.

14. The method of claim 10, wherein the frequency of the magnetic field is less than a frequency at which heat is generated outside the substrate.

15. The method of claim 10, further comprising horizontally rotating the substrate during the application of the microwave.

16. The method of claim 10, wherein the frequency of the microwave ranges from 0.8 $GH_z$ to 25 $GH_z$.

17. The method of claim 16, wherein the temperature of the substrate during the application of the microwave ranges from 600° C. to 850° C.

18. The method of claim 16, wherein the temperature of the substrate during the application of the microwave ranges from 300° C. to 450° C.

19. The method of claim 10, wherein the insulating film comprises at least one of a silicon oxide film ($SiO_2$) and a high-dielectric-constant film.

20. The apparatus of claim 1, wherein the magnetic field generating portions are provided on upper and lower wall surfaces of the housing across the substrate.

* * * * *